(12) United States Patent
Blayvas

(10) Patent No.: US 12,272,518 B2
(45) Date of Patent: *Apr. 8, 2025

(54) 3D METROLOGY FROM 3D DATACUBE CREATED FROM STACK OF REGISTERED IMAGES OBTAINED DURING DELAYERING OF THE SAMPLE

(71) Applicant: APPLIED MATERIALS ISRAEL LTD., Rehovot (IL)

(72) Inventor: Ilya Blayvas, Jerusalem (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/213,220

(22) Filed: Jun. 22, 2023

(65) Prior Publication Data

US 2023/0335370 A1    Oct. 19, 2023

Related U.S. Application Data

(63) Continuation of application No. 17/357,948, filed on Jun. 24, 2021, now Pat. No. 11,728,126.

(51) Int. Cl.
*H01J 37/28* (2006.01)
*H01J 37/22* (2006.01)
(Continued)

(52) U.S. Cl.
CPC .......... *H01J 37/222* (2013.01); *H01J 37/265* (2013.01); *H01J 37/28* (2013.01); *H01J 37/3056* (2013.01);
(Continued)

(58) Field of Classification Search
None
See application file for complete search history.

(56) References Cited

U.S. PATENT DOCUMENTS

| 6,670,610 B2 | 12/2003 | Shemesh et al. |
| 8,709,269 B2 | 4/2014 | Shemesh |

(Continued)

FOREIGN PATENT DOCUMENTS

KR    20200135218 A    12/2020

OTHER PUBLICATIONS

PCT/US2022/030951, "International Preliminary Report on Patentability", Jan. 4, 2024, 7 pages.

(Continued)

*Primary Examiner* — Eliza W Osenbaugh-Stewart
(74) *Attorney, Agent, or Firm* — Kilpatrick Townsend & Stockon LLP

(57) ABSTRACT

A method of evaluating a region of interest of a sample including: positioning the sample within in a vacuum chamber of an evaluation tool that includes a scanning electron microscope (SEM) column and a focused ion beam (FIB) column; acquiring a plurality of two-dimensional images of the region of interest by alternating a sequence of delayering the region of interest with a charged particle beam from the FIB column and imaging a surface of the region of interest with the SEM column; generating an initial three-dimensional data cube representing the region of interest by stacking the plurality of two-dimensional images on top of each other in an order in which they were acquired; identifying distortions within the initial three-dimensional data cube; and creating an updated three-dimensional data cube that includes corrections for the identified distortions.

15 Claims, 10 Drawing Sheets

(51) Int. Cl.
*H01J 37/26* (2006.01)
*H01J 37/305* (2006.01)

(52) U.S. Cl.
CPC .......... *H01J 2237/2555* (2013.01); *H01J 2237/2561* (2013.01); *H01J 2237/2807* (2013.01); *H01J 2237/31749* (2013.01)

(56) References Cited

U.S. PATENT DOCUMENTS

| | | |
|---|---|---|
| 9,934,938 B2 | 4/2018 | Uemoto et al. |
| 9,964,654 B2 | 5/2018 | Laake |
| 10,811,219 B2 | 10/2020 | Shneyour et al. |
| 2009/0296073 A1 | 12/2009 | Wagganer |
| 2013/0082176 A1 | 4/2013 | Yamamoto et al. |
| 2013/0094716 A1 | 4/2013 | Carpio et al. |
| 2015/0115156 A1 | 4/2015 | Suzuki et al. |
| 2016/0181061 A1 | 6/2016 | Kim et al. |
| 2019/0355550 A1 | 11/2019 | Hayworth et al. |
| 2022/0138973 A1 | 5/2022 | Korb et al. |

OTHER PUBLICATIONS

U.S. Appl. No. 17/357,948, "Final Office Action", filed Feb. 17, 2023, 14 pages.
U.S. Appl. No. 17/357,948, "Non-Final Office Action", filed Sep. 26, 2022, 18 pages.
U.S. Appl. No. 17/357,948, "Notice of Allowance", filed Apr. 26, 2023, 10 pages.
PCT/US2022/030951, "International Search Report and Written Opinion", Sep. 23, 2022, 11 pages.
Zakrzewski, et al., "A Three-Dimensional Reconstruction of Coal Microstructure using the Cryo-Fib-Sem Technique", Fuel, vol. 275 Available Online at: https://doi.org/10.1016/j.fuel.2020.117919, Sep. 1, 2020, pp. 1-11.

3D METROLOGY FROM 3D DATACUBE CREATED FROM STACK OF REGISTERED IMAGES OBTAINED DURING DELAYERING OF THE SAMPLE

CROSS-REFERENCES TO RELATED APPLICATIONS

This application is a continuation of U.S. patent application Ser. No. 17/357,948, filed Jun. 24, 2021, the contents of which are hereby incorporated by reference in its entirety.

BACKGROUND OF THE INVENTION

In the study of electronic materials and processes for fabricating such materials into an electronic structure, a specimen of the electronic structure can be used for microscopic examination for purposes of failure analysis and device validation and metrology. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

In preparing specimens of an electronic structure for electron microscopic examination, various polishing and milling processes can be used to section the structure until a specific characteristic feature is exposed. As device dimensions are continuously reduced to the nanometer scale, the techniques for preparing specimens for study in an electron microscope have become more important. The conventional methods for studying structures by an optical microscope cannot be used to study features in a modern electronic structure due to the unacceptable resolution of an optical microscope.

SEM imaging techniques can be used to see a surface of a region of interest (ROI) within a specimen and can also be used to see the bulk of the material within the ROI. For example, a ROI on a specimen can be bombarded with ions of Xenon, Gallium or other elements generated by a focused ion beam (FIB) column to erode the surface layer of the specimen in the ROI, thus allowing layers within the ROI below the surface, and initially covered by material above, to be imaged.

A dual column system incorporating both a scanning electron microscope and a focused ion beam (FIB) unit can produce high resolution SEM images of a localized area of an electronic structure formed on a sample, such as a semiconductor wafer. A typical dual column system includes an SEM column, an FIB column, a supporting element that supports the sample and a vacuum chamber in which the sample is placed while being milled (by the FIB column) and while being imaged (by the SEM column).

Removing one or more selected layers (or a portion of a layer) to uncover or isolate a portion of the specimen is known as delayering and can be done in a dual column system, such as that described above. For example, delayering can be done by: (i) locating a region of interest that should be milled in order to remove a certain thickness of material from the specimen, (ii) moving the sample (e.g., by a mechanical supporting element) so that the specimen is located under the FIB unit, and (iii) milling the specimen to remove a desired amount of material in the region of interest. The above steps of a delayering process can be repeated many times (e.g., tens or hundreds or thousands of times) forming a dent or a hole in the specimen (usually sized a few microns to few tens of microns in lateral and vertical dimensions).

By taking SEM images of the surface every few nanometers of the delayering process, tens to hundreds or more images can be collected at even depth intervals throughout the delayering process creating a three-dimensional image of the delayered region of interest. Furthermore, by applying Energy-Dispersive X-ray spectroscopy (EDX), the exact chemical composition of the sample structures within the region of interest can be measured at different depths.

When attempting to delayer a sample, the geometry of the structure being milled can present challenges in delayering the structure in a uniform manner. For example, different materials present in and/or different structures formed in different portions of a region being delayered can result in one portion of the region being milled faster than another portion. The nonuniform milling rate can make accurate metrology difficult in such areas. Accordingly, improved metrology techniques are desirable.

BRIEF SUMMARY OF THE INVENTION

Embodiments of the disclosure pertain to an improved method and system for creating a three-dimensional image of a region within a sample via a delayering process. Embodiments of the disclosure can be employed to create an accurate three-dimensional image of such a sample even if the materials or structures within the region being delayered result in a nonuniform milling rate at different portions of the region. While embodiments of the disclosure can be used to delayer structures formed on a variety of different types of samples, some embodiments are particularly useful in delayering samples that are semiconductor wafers or similar specimens.

In some embodiments, a method of evaluating a region of interest of a sample is provided. The method can include: positioning the sample within in a vacuum chamber of an evaluation tool that includes a scanning electron microscope (SEM) column and a focused ion beam (FIB) column; acquiring a plurality of two-dimensional images of the region of interest by alternating a sequence of delayering the region of interest with a charged particle beam from the FIB column and imaging a surface of the region of interest with the SEM column; and generating an initial three-dimensional data cube representing the region of interest by stacking the plurality of two-dimensional images on top of each other in an order in which they were acquired.

Various implementations of the embodiments described herein can include one or more of the following features. The method can further include estimating distortions within the initial three-dimensional data cube and/or applying an inverse transformation to correct the estimated distortions creating an updated three-dimensional data cube in which the distortions are eliminated or diminished. In some instances estimating the distortions can include comparing geometric structures measured in the initial data cube to a ground truth geometry. In some instances estimating the distortions can include identifying locations of different materials within the initial data cube known to have different milling rates, and estimating distortions within the initial three-dimensional data cube based on the identified locations of the different materials and the known different milling rates. In some instances applying an inverse transformation to correct the estimated distortions can include applying reciprocal distortions to the initial data cube calculated based on the locations of and the different milling rates of the different materials. The method can further include segmenting the initial data cube into a plurality of uniform regions; performing chemical composition measurements of each of the plurality of uniform regions; and/or adding results of the chemical composition measurements to the initial three-dimensional data cube. In some instances the chemical composition measurements can be performed separately on each of the plurality of uniform regions by taking chemical composition measurements on a selected subset of delayered slices of the sample taken during the acquiring step. In some instances the chemical composition of each region can be determined by averaging EDX composition measurements of each region. The method can further include aligning the plurality of two-dimensional images to each other prior to generating the initial three-dimensional data cube. The method can further include creating a virtual cross-section at a pre-defined position and direction by calculating points corresponding to an intersection of the cross-section with the data cube and sampling the data cube in the calculated points. The region of interest can include a first sub-region and a second sub-region, adjacent to the first sub-region. A geometry and/or materials in the first sub-region can be different than a geometry and/or materials in the second sub-region such that the first sub-region has a first milling rate and the second sub-region has a second milling rate different than the first milling rate.

Some embodiments pertain to a non-transitory computer-readable medium that stores instructions for evaluating a region of interest of a sample is provided. For example, by: positioning the sample within in a vacuum chamber of an evaluation tool that includes a scanning electron microscope (SEM) column and a focused ion beam (FIB) column; acquiring a plurality of two-dimensional images of the region of interest by alternating a sequence of delayering the region of interest with a charged particle beam from the FIB column and imaging a surface of the region of interest with the SEM column; and generating an initial three-dimensional data cube representing the region of interest by stacking the plurality of two-dimensional images on top of each other in an order in which they were acquired.

Some embodiments pertain to a system for performing x-ray spectroscopy surface material analysis of a region of a sample according to any of the methods set forth above or herein. For example, the system can include: a vacuum chamber; a sample support configured to hold a sample within the vacuum chamber during a sample evaluation process; a focused ion beam (FIB) column configured to direct a charged particle beam into the vacuum chamber toward the sample; a scanning electron microscope (SEM) column configured to direct a charged particle beam into the vacuum chamber toward the sample; and a processor and a memory coupled to the processor. The memory can include a plurality of computer-readable instructions that, when executed by the processor, cause the system to: position the sample within in a vacuum chamber of an evaluation tool that includes a scanning electron microscope (SEM) column and a focused ion beam (FIB) column; acquire a plurality of two-dimensional images of the region of interest by alternating a sequence of delayering the region of interest with a charged particle beam from the FIB column and imaging a surface of the region of interest with the SEM column; and generate an initial three-dimensional data cube representing the region of interest by stacking the plurality of two-dimensional images on top of each other in an order in which they were acquired.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to an improved method and system for creating a three-dimensional image of a region within a sample via a delayering process. Embodiments of the disclosure can be employed to create an accurate three-dimensional image of such a sample even if the materials or structures within the region being delayered result in a nonuniform milling rate at different portions of the region.

Example Sample Evaluation Tool

Figure 1:
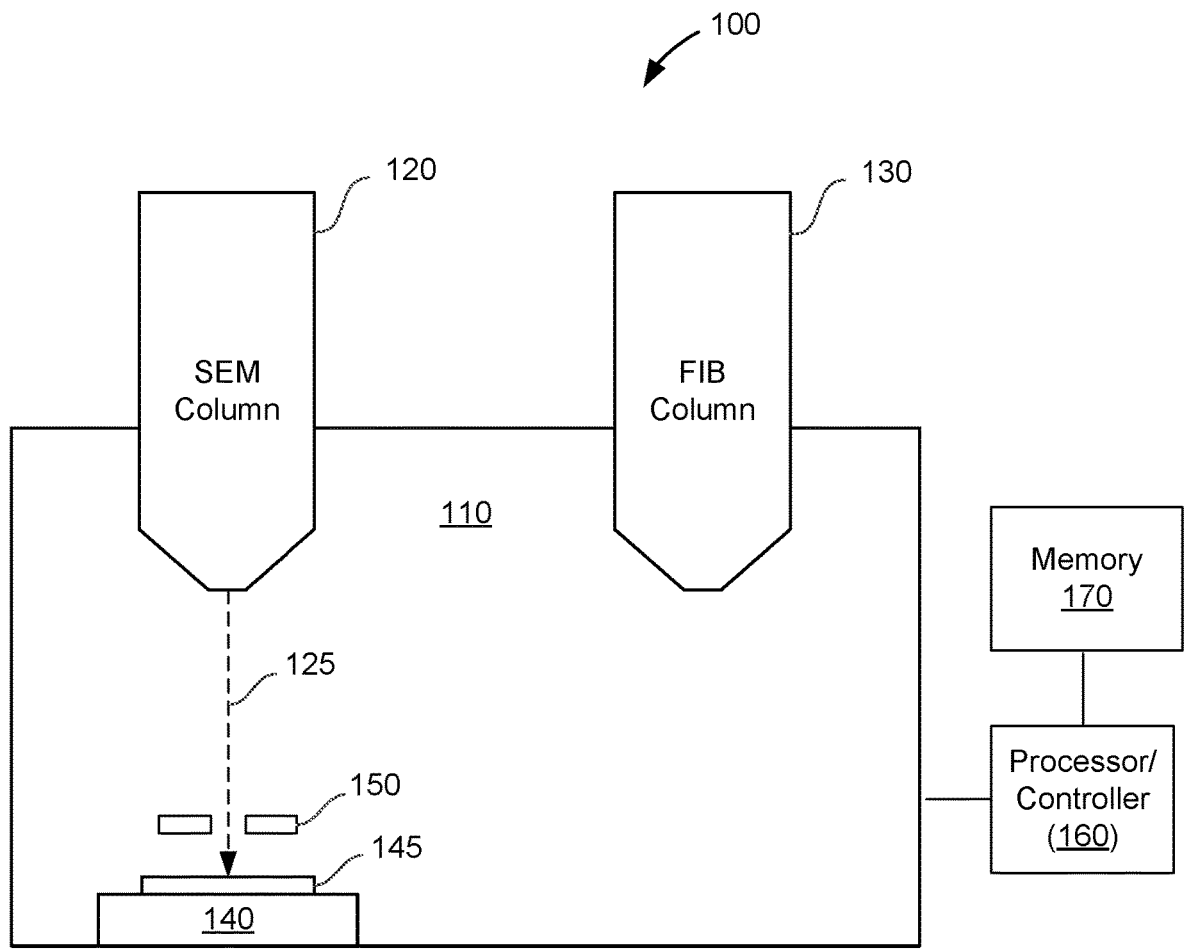
FIG. 1 is simplified illustration of a sample evaluation system according to some embodiments of the disclosure.

In order to better understand and appreciate the disclosure, reference is first made to FIG. 1, which is a simplified schematic illustration of a sample evaluation system 100 according to some embodiments of the disclosure. Sample evaluation system 100 can be used for, among other operations, defect review and analysis (including x-ray imaging) of structures formed on samples, such as semiconductor wafers.

System 100 can include a vacuum chamber 110 along with a scanning electron microscope (SEM) column 120 and a focused ion beam (FIB) column 130. A supporting element 140 (e.g., a sample support pedestal) can support a sample 145 (e.g., a semiconductor wafer) within chamber 110 during a processing operation in which the sample 145 (sometimes referred to herein as an "object" or a "specimen") is subject to a charged particle beam from one of the FIB or SEM columns. Supporting element 140 can also move the sample within vacuum chamber 110 between the field of view of the two columns 120 and 130 as required for processing.

SEM column 120 and FIB column 130 are connected to vacuum chamber 110 so that a charged particle beam generated by either one of the charged particle columns propagates through a vacuumed environment formed within vacuum chamber 110 before impinging on sample 145. SEM column 120 can generate an image of a portion of sample 145 by illuminating the sample with a charged particle beam (e.g., electron beam 125), detecting particles emitted due to the illumination and generating charged particle images based on the detected particles. Towards that end, system 100 can include a detector 150, such as an energy-dispersive x-ray spectroscopy (EDX) detector or a wavelength-dispersive x-ray spectroscopy (WDX) detector, that can be used to determine a composition of one or more microscopic structures within sample 145. The EDX detector 150 can collect x-ray photons emitted as a result of an illumination of the structures by electron beam 125, and can include an energy analyzer for determining the energy of photons that are detected by the detector, which in turn can enable system 100 to characterize the element from which an x-ray photon was emitted.

FIB column 130 can mill (e.g., drill a hole in or form a dent in) sample 145 by irradiating the sample with one or more charged particle beams to form a cross section and can also smooth the cross section. The cross section can include, at different locations along the cross-section, different materials that can subsequently be analyzed with SEM column 120.

The particle imaging and milling processes each typically include scanning a charged particle beam back-and-forth (e.g., in a raster scan pattern) at a constant rate across a particular area of the sample being imaged or milled. One or more lenses (not shown) coupled to each charged particle column can implement the scan pattern as is known to those of skill in the art. The area scanned is typically a very small fraction of the overall area of sample. For example, the sample can be a semiconductor wafer with a diameter of either 150, 200 or 300 mm while each area scanned on the wafer can be a rectangular area having a width and/or length measured in microns or tens of microns.

System 100 can include one or more controllers 160, such as one or more processors or other hardware units that control the operation of system 100 by executing computer instructions stored in one or more computer-readable memories 170 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

While not shown in FIG. 1, sample evaluation system 100 can include a number of additional components including, but not limited to, one or more gas nozzles to deliver process gases to chamber 110, vacuum and other valves to control the pressure within chamber 110, and one or more lenses to direct the charged particle beam (as mentioned above) among other components.

Creating a Three-Dimensional Model Using Delayering Techniques

Figure 2A:
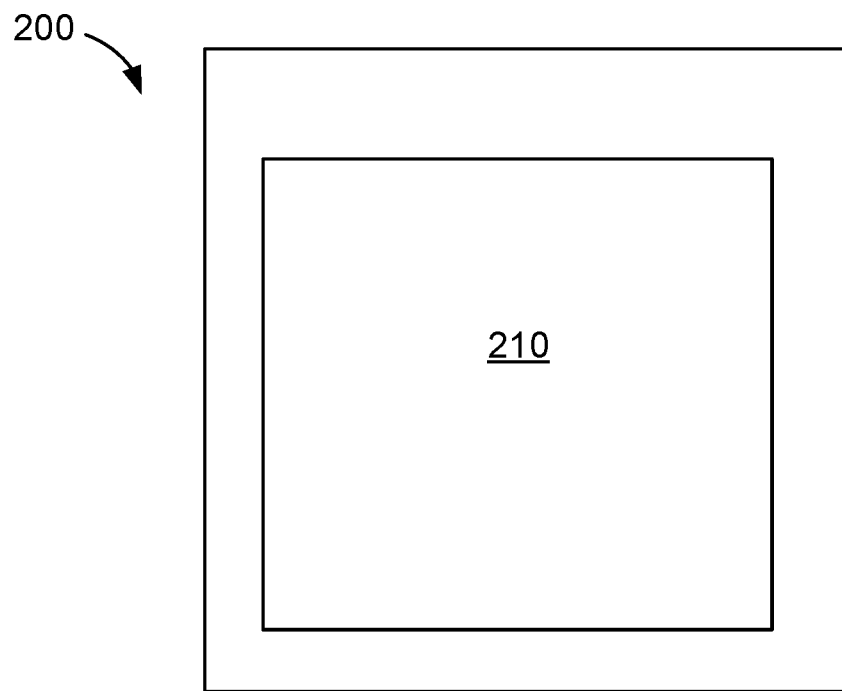
FIG. 2A is a simplified top view diagram of a region of interest within a sample.
Figure 2B:
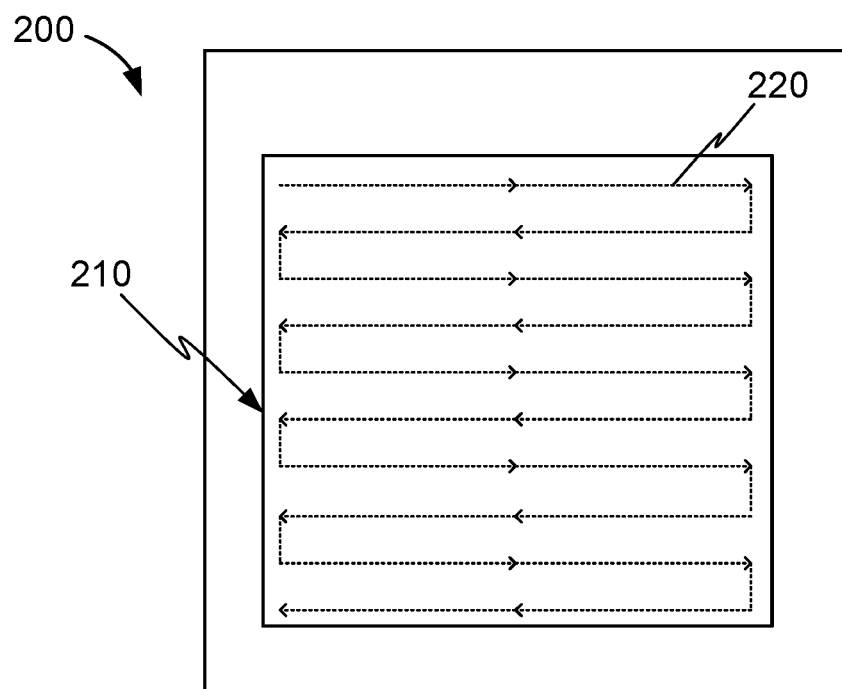
FIG. 2B is a simplified example of a scan pattern that can be used to mill the region of interest shown in FIG. 2A.
Figure 2C:
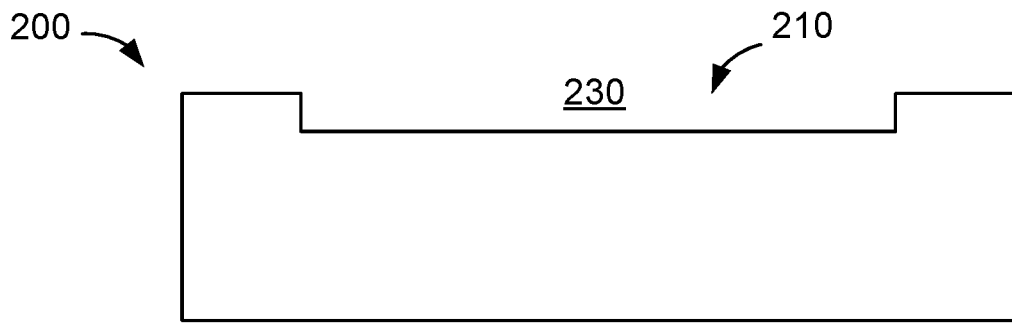
FIGS. 2C-2F are simplified cross-sectional views of the region of interest shown in FIG. 2A at different stages of a delayering process.
Figure 2D:
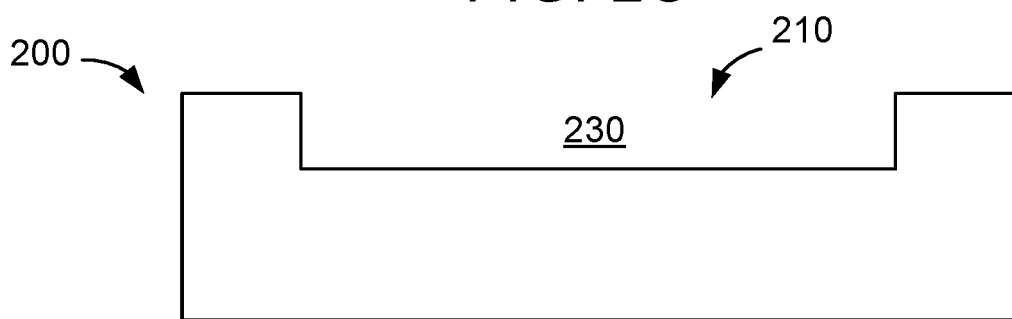
Figure 2E:
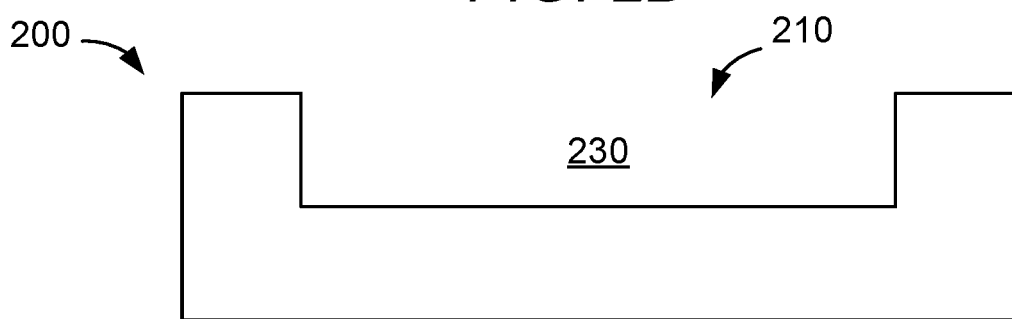
Figure 2F:
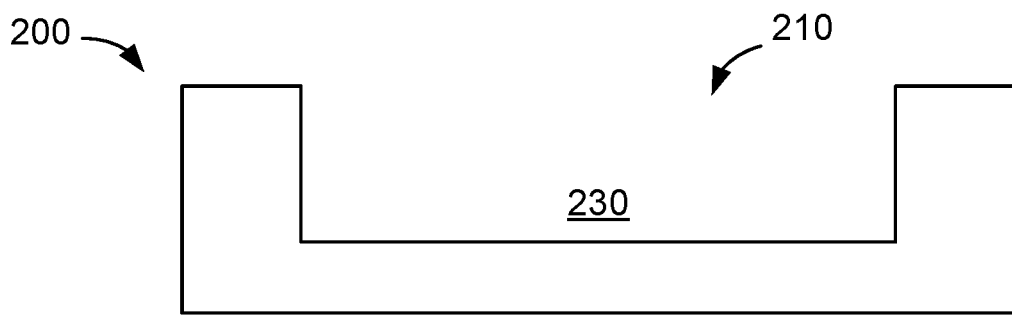

System 100 is one example of an evaluation system that can be used in accordance with the techniques disclosed herein to delayer a region of a sample and generate a three-dimensional model of the delayered region. To illustrate, reference is made to FIGS. 2A, which is a simplified top view illustration of a sample 200. As shown in FIG. 2A, sample 200, which as an example can be a semiconductor wafer, includes a region 210 (sometimes referred to as a "frame") that can be delayered and imaged. For example, region 210 can be delayered by repeatedly scanning a focused ion beam across the region according to the scan pattern 220 depicted in FIG. 2B. Each iteration of the delayering process removes a minute amount of material from the surface of sample within region 210.

Figure 3A:
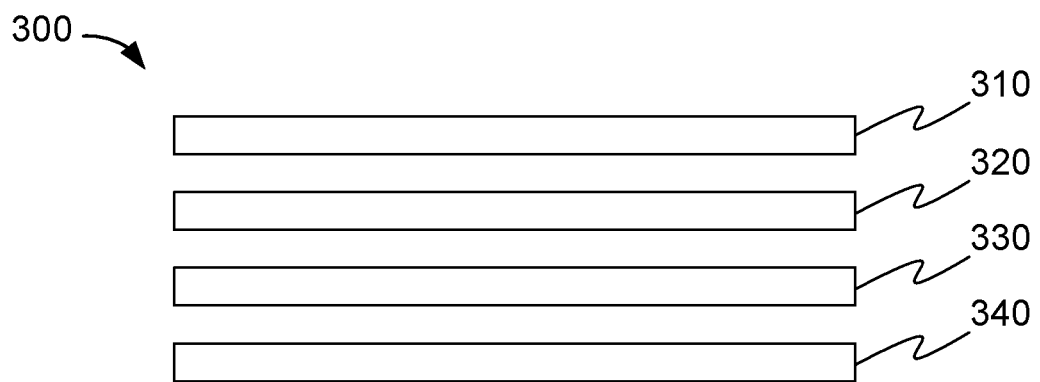
FIG. 3A is simplified illustration of a collection of images that can be generated during a delayering process of the region depicted in FIG. 2A.
Figure 3B:
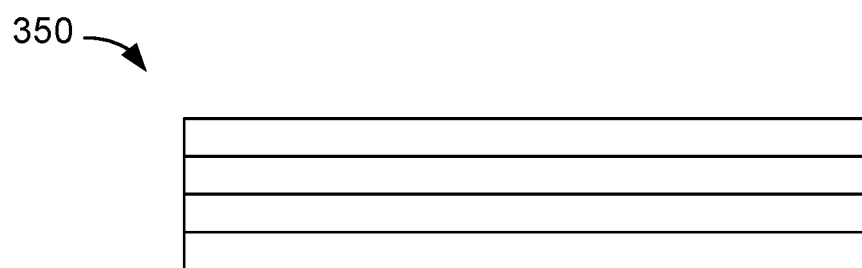
FIG. 3B is a simplified illustration of a three-dimensional model of a region of interest generated from the collection of images depicted in FIG. 3A.

FIG. 2C-2F depict a simplified cross-sectional view of sample 200 in which region 210 at various stages of a milling process in which a hole 230 is formed within region 210. As evident from a comparison of the different FIGS. 2C-2F, as the milling process proceeds, hole 230 gets deeper and deeper. A three-dimensional model of region 210 can be created by imaging region 210 at various intervals of the delayering process, for example, at each of the stages shown by FIGS. 2C-2F. In an ideal process, the entirety of region 210 is milled at a uniform rate and each image taken during the process represents a planar slice of region 210 at a given time. Thus, if images are taken at immediately after the delayering step illustrated by FIGS. 2C-2F, a collection 300 of four images would be generated including images 310, 320, 330 and 340 as shown in FIG. 3A. The images from collection 300 can then be stitched together (e.g., using currently available image processing software) to form a three-dimensional model 350 shown in FIG. 3B that is four "layers" deep. It is to be understood that, for ease of illustration, FIGS. 2A-2F are greatly simplified and not drawn to scale. Also, in practice, three-dimensional models formed using this technique can be formed from many tens, hundreds or any number of images and thus can be many tens, hundreds or thousands layers deep.

Challenges in Generating a Three-Dimensional Model

Figure 4A:
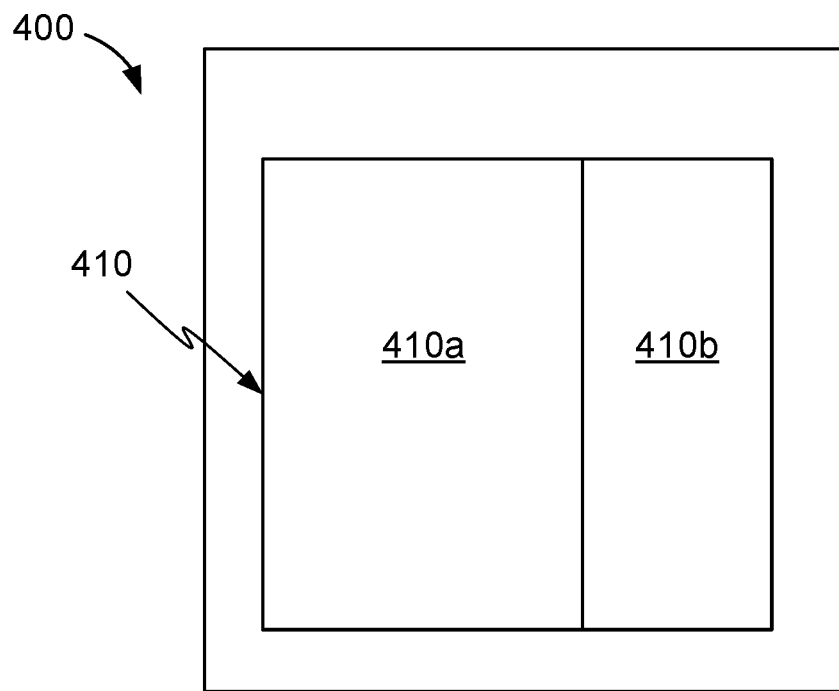
FIG. 4A is a simplified top view diagram of a region of interest within a sample that includes multiple sub-regions having different milling rates.

The process discussed above with respect to FIGS. 2A-2F and 3A, 3B is greatly simplified and is not representative of all delayering processes. For example, in some samples the region 210 being delayered and imaged can have two or more different sub-regions that are made up of different materials or include different structures and thus exhibit different milling rates. In such instances it can be challenging to generate an accurate three-dimensional model of the region. To illustrate, reference is made to FIG. 4A, which is a simplified top view illustration of a sample 400. As shown in FIG. 4A, sample 400, which as an example can be a semiconductor wafer, includes a region or frame 410 that is to be delayered and imaged. Region 410 includes two sub-regions 410*a* and 410*b* where sub-region 410*a* includes features made from different materials than sub-region 410*b* and/or has a different geometry than sub-region 410*b*. As a result of the differences between the two sub-regions, the milling rate of sub-region 410a can be slightly faster than or slightly slower than the milling rate of sub-region 410b. The differences in milling rates can result in images taken during the delayering process representing something other than a planar surface of the sample that images 310-340 represented.

Figure 4B:
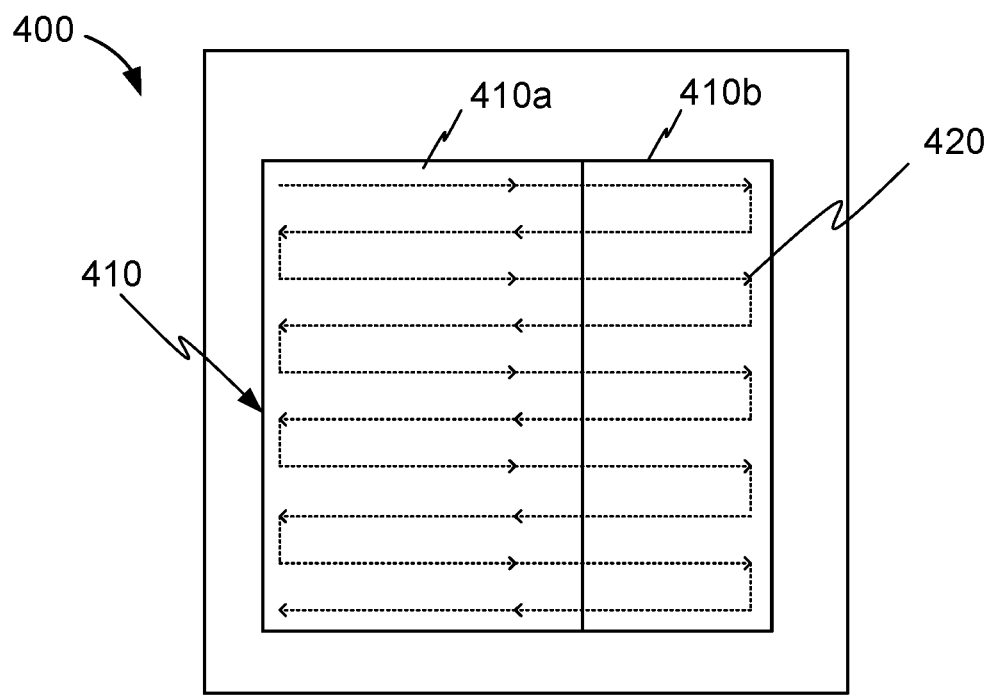
FIG. 4B is a simplified example of a scan pattern that can be used to mill the region of interest shown in FIG. 4A.

Regardless of the reason for the different milling rates, in some evaluation processes it is desirable to delayer region 410 by scanning a focused ion beam across the entirety of the region as described above with respect to FIG. 2A. FIG. 4B depicts an exemplary scan pattern 420 that can be used to delayer the sample 400. As shown in FIG. 4B, scan pattern 420 traverses the entirety of region 410, including both sub-region 410a and sub-region 410b with a single continuously scanned beam at a constant velocity or scan rate and with other parameters of the milling process (e.g., beam width, beam strength, etc.) held constant. As a result, as the milling process proceeds (e.g., after the ion beam is scanned across region 410 many thousands of times or even millions of times), region 410 will exhibit a non-uniform profile where the sub-region 410a or sub-region 410b having the faster milling rate is milled deeper than the other sub-region with the slower milling rate. In some instances, the slices made through region 410 can have a parabolic cross-sectional profile instead of a planar profile.

Figure 4C:
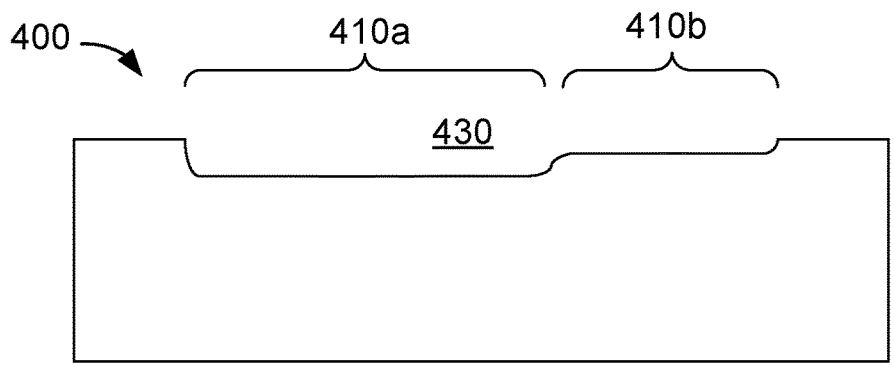
FIGS. 4C-4F are simplified cross-sectional views of the region of interest shown in FIG. 4A at different stages of a delayering process.
Figure 4D:
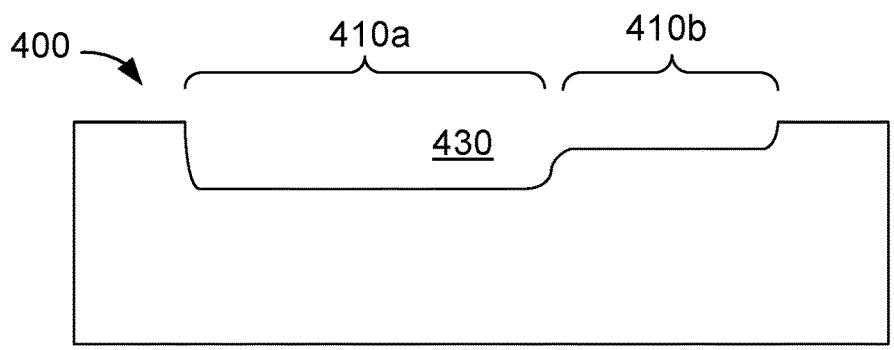
Figure 4E:
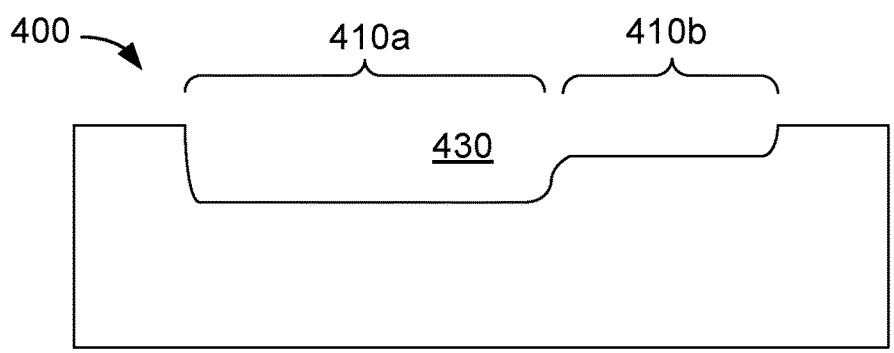
Figure 4F:
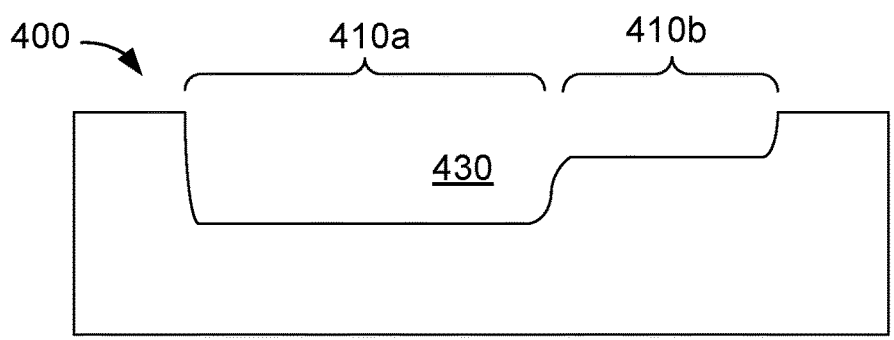

FIGS. 4C-4F are simplified cross-sectional illustrations of sample 400 shown in FIG. 4A at different stages of a delayering process using the scan pattern depicted in and discussed with respect to FIG. 4B where region 410a has a faster milling rate than region 410b. Specifically, FIG. 4C is a cross-sectional view of sample 400 relatively early in the delayering process, FIG. 4D is a cross-sectional view of sample 400 at a stage of the delayering process subsequent to FIG. 4C and FIGS. 4E and 4F are cross-sectional views of sample 400 at still later stages. As evident from the FIGS. 4C-4F, due to the difference in milling rates between the two sub-regions 410a, 410b, there is a difference in depth at which each region is milled at given point in time. The difference can result in an upper surface of the sample having a parabolic or other non-planar surface.

Thus, unlike the collection of images 300 depicted in FIG. 3A, SEM images taken during the delayering process illustrated in FIGS. 4C-4F do not represent flat planar slices of the sample. Instead, a collection of images can be generated where several or more images in the collection 500 represent non-planar slices (e.g., slices having a parabolic surface) through the imaged region 410. As discussed with respect to FIGS. 2A-2F, it is to be understood that FIGS. 4A-4F are greatly simplified for ease of illustration and are not drawn to anywhere close scale. For example, each of the individual images 510-540 may represent a cross-sectional slice through sample 400 just a few nanometers thick.

Figure 5A:
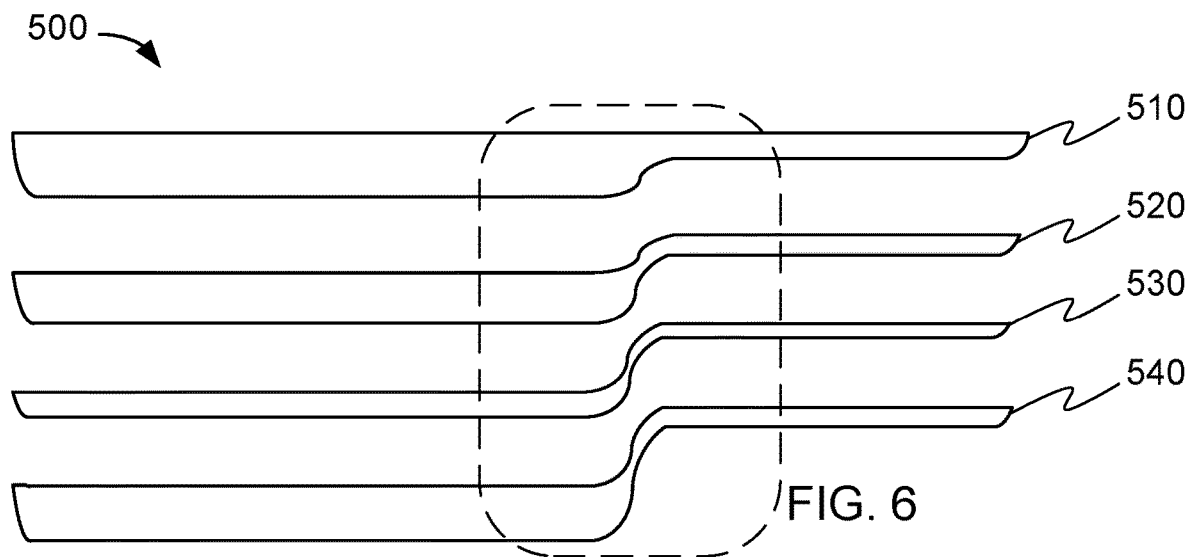
FIG. 5A is simplified illustration of a collection of images that can be generated during a delayering process of the region depicted in FIG. 4A.
Figure 5B:
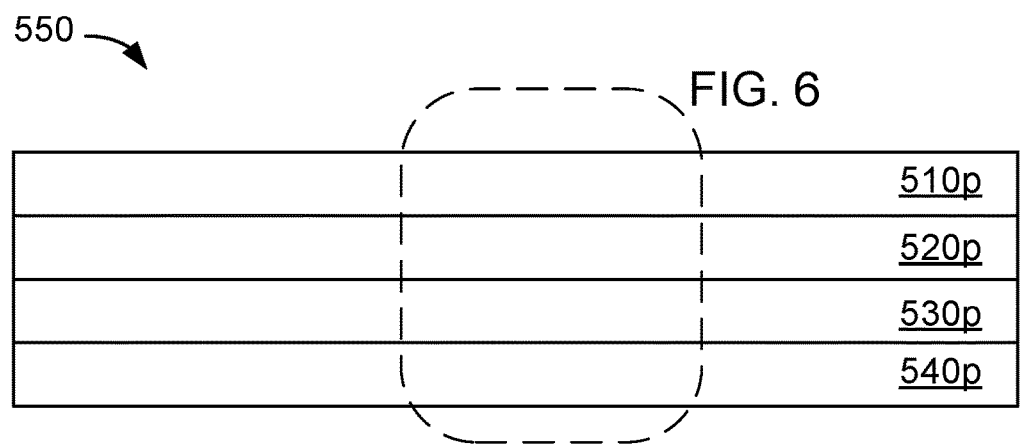
FIG. 5B is a simplified illustration of a three-dimensional model of a region of interest generated from the collection of images depicted in FIG. 5A.

If images are taken at immediately after the delayering steps illustrated by FIGS. 4C-4F, a collection 500 of four images would be generated including images 510, 520, 530 and 540 as shown in FIG. 5A. If the images from collection 500 are stitched together (e.g., using currently available image processing software) without modification, the collection of images would form a three-dimensional model four "layers" deep that assumes each image is planar and thus may look something like model 550 shown in FIG. 5B where each individual image 510-540 represents a planar layer 510p, 520p, 530p and 540p, respectively, of the model 550.

Figure 6:
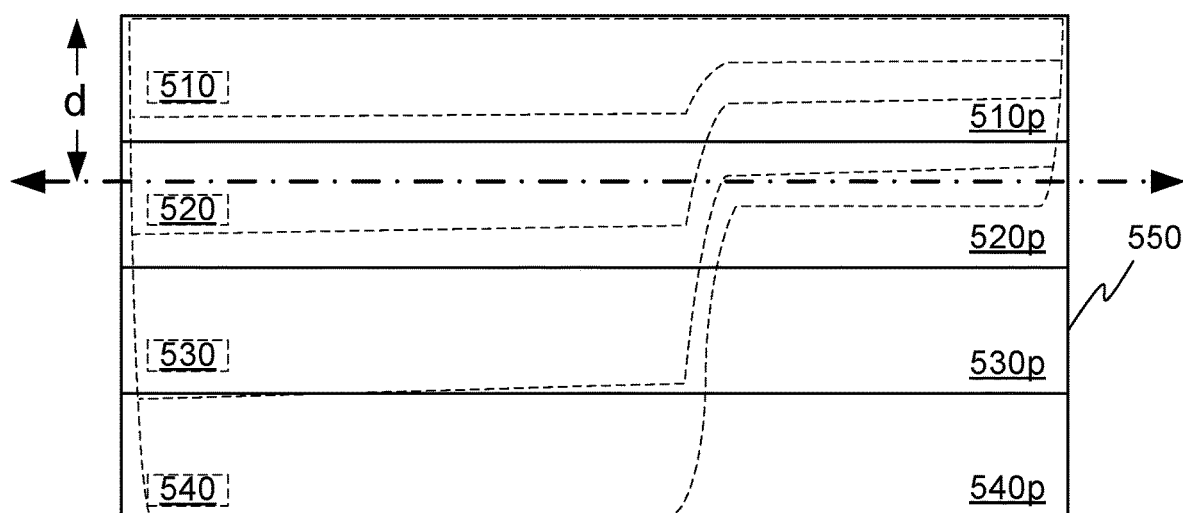
FIG. 6 is a simplified diagram that illustrates potential inaccuracies of the three-dimensional model shown in FIG. 5B.

As can be appreciated, model 550 might not be an accurate representation of the region 410 that was delayered. To illustrate, reference is made to FIG. 6, which is a simplified cross-sectional view of a portion of a central portion of hole 430 (i.e., including the border area between the two sub-regions 410a, 410b) as represented by images 510-540 superimposed over a portion of three-dimensional model 550 shown in FIG. 5B. As can be seen in FIG. 6, if model 550 was used to evaluate region 410 at depth, d, the evaluation would indicate that layer 520p accurately represents the materials and features within region 410 at the depth d. Instead, however, FIG. 6 shows that in order to accurately represent region 410 at depth d, portions of images 520, 530 and 540 need to combined.

Creating a Three-Dimensional Data Cube

Accordingly, embodiments of the disclosure process each image 510, 520, 530, 540 to form a collection of images that can be combined to form a three-dimensional data cube that more accurately reflects the delayered region than does three-dimensional model 550. As used herein, a three-dimensional data cube refers to a three-dimensional (3D) (or higher) range of values that can be used to model a time sequence (which in the case of a delayering process is correlated to depth) of an image's data. It is a data abstraction to evaluate aggregated data from a variety of viewpoints. A data cube can be described as the multidimensional extensions of two-dimensional tables and can be viewed as a collection 2-D tables of identical sizes stacked upon one another where the position of each table within the stack represents a depth within the sample modeled by the data cube.

Figure 7:
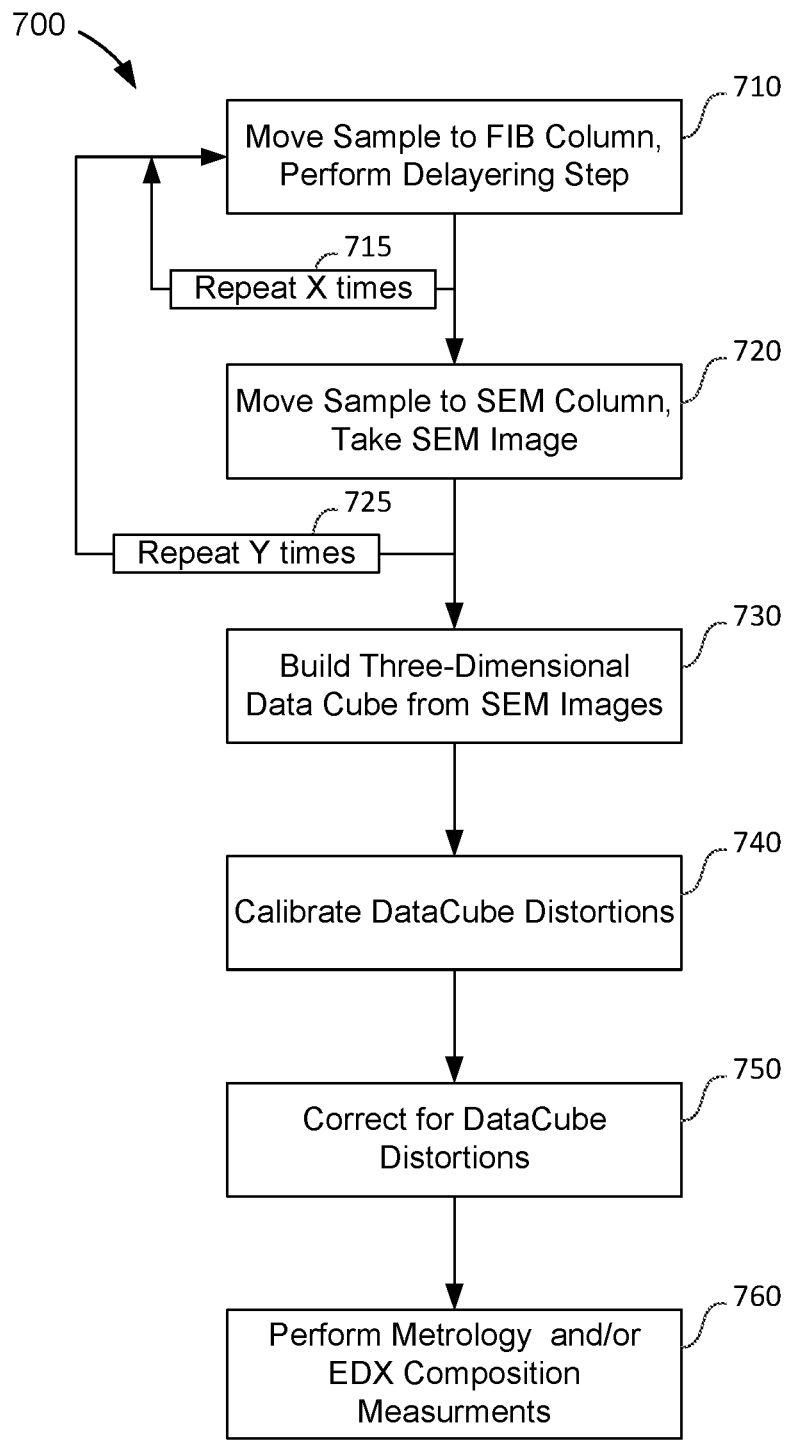
FIG. 7 is a flowchart depicting steps associated with analyzing a sample according to some embodiments of the disclosure.

FIG. 7 is a flowchart that depicts steps associated with a method 700 according to some embodiments. Method 700 can be carried out, for example, by evaluation system 100 discussed above with respect to FIG. 1 or a similar system. As shown in FIG. 7, method 700 can start by positioning a sample within a field of view of a focused ion beam (FIB) column and scanning a charged particle beam across a region of interest (ROI) of the sample to remove (delayer) a very thin layer from the sample (block 710). Because each layer removed is so thin, in some embodiments the charged particle beam can be scanned across the ROI multiple times (e.g., hundreds or thousands of times) to remove additional material prior to an imaging step (block 715).

Next, the sample is moved away from the FIB column into the field of view of the scanning electron microscope (SEM) column where the ROI can be scanned with an electron beam and an SEM image of the ROI can be captured (block 720). In order to make a three-dimensional data cube of the ROI, many additional SEM images can be captured at different depths of the sample. Thus, the delayering and image taking steps can be repeated multiple times (e.g., many tens or hundreds or more) depending on the requirements of a given evaluation process (block 725).

As evident from the discussion above, the sample is moved in method 700 between the FIB column to the SEM column for each SEM image. While evaluation tool 100 enables highly precise movement and control of the sample, the SEM images resolution can reach 1 nm or less, and therefore a difference in sample location of just a few nanometers results in SEM images that are not aligned properly and can adversely impact any model that is created from the images. Thus, in order to build a three-dimensional data cube (block 730), the different SEM images taken during block 720 can be registered to (aligned with) each other. Registration can be done in several different ways. In some embodiments, an anchor-based alignment approach can be employed. For example, each SEM image taken in block 720 can be an image the captures the ROI along with one or more features of the sample outside the region of interest (and therefore not within the region that is delayered) that can be identified as unique in the SEM (e.g., feature 820 shown in FIG. 8) and thus considered as anchor for each image. The anchor can then be used to align images after the images have been taken. For example, two images can be aligned by using an image translation in which the anchor feature in one is compared to (e.g., subtracted from) the anchor feature in the other and adjustments are made (one image is moved with respect to the other) until it is determined the anchor feature in the compared images are precisely aligned (e.g., there are zero differences in the comparison). Practical methods may differ from this simplified explanation, and employ image processing techniques such as Fourier Transform to accelerate the image registration algorithms as known in the art.

In other embodiments the anchor can be used to precisely align each image to the anchor prior to capturing the image. For example, two SEM images can be taken of the sample in block 720 where a first SEM image is taken of an area of the sample that includes the anchor (e.g., feature 820 shown in FIG. 8). This first image can, but does not need to include the ROI. Then, using image registration or pattern recognition techniques, the precise location of the anchor can be identified in the SEM image. Next, without moving the sample and based on the known location of the ROI with respect to the anchor, the electron beam can be directed to and scanned across ROI using the lenses within the SEM column to capture an SEM image of the ROI. This technique can be used for each SEM image of the ROI taken in block 720 such that the images, as taken, are preregistered to each other and additional alignment is not required. In still other embodiments, image-based registration techniques can be used to register the multiple images to each other.

Once the images have been registered to each other and an initial version of the data cube compiled, embodiments can identify distortions in the data cube that can be corrected (block 740). In some embodiments distortions can be identified and calibrated by comparing the data cube generated in block 730 to what can be referred to as the "Ground Truth". As used herein, the "ground truth geometry" refers to the geometry of geometric structures within the specimen that would be produced from a manufacturing process, absent manufacturing variances, according to the known steps of the manufacturing process. Thus, the ground truth is information that would be known to be true if there were no manufacturing variances or other deviations during the manufacturing process of the specimen. The Ground Truth can typically be obtained from an entity (e.g., customer) that knows the layout and fabrication details that were used in fabricating the sample in the first place. In other embodiments, distortions can be identified and calibrated by comparing the initial data cube to results from delayering a three-dimensional region of interest of a known metrology having the same intended layout and manufactured using the same fabrication process as the sample. In some embodiments distortions can be identified and calibrated (block 740) based on different known milling rates of different materials within the region of interest. For example, the locations of different materials within the region of interest that are known to have different milling rates can be determined. Then, distortions within the initial three-dimensional data cube can be estimated and corrected for by applying reciprocal distortions to the initial data cube calculated based on the locations of and the different milling rates of the different materials.

Next, any distortions that have been identified can be corrected (block 750). In some embodiments, corrections can be made by calculating and applying transformations inverse to the distortions measured or otherwise determined in block 740. Once the transformations are applied to the initial data cube, the updated or transformed data cube will represent a more accurate model of the delayered region and enable metrology operations to perform nondestructive, virtual slicing of the data cube in any desired direction according to a metrology specification (block, 760). For example, a virtual cross-section of the region of interest can be created at a pre-defined position and direction by calculating points corresponding to an intersection of the cross-section with the data cube and sampling the data cube in the calculated points.

While not shown in FIG. 7, in some embodiments method 700 can further include adding EDX data to the data cube. For example, EDX composition measurements can be performed using low-resolution, fast EDX on a selected subset of the delayering slices taken during block 710. The three-dimensional data cube can be segmented into different regions and the results of the low-resolution, fast EDX measurements can be used to average the composition of the segmented regions and label each accordingly.

Example of a Sample to be Milled

Figure 8:
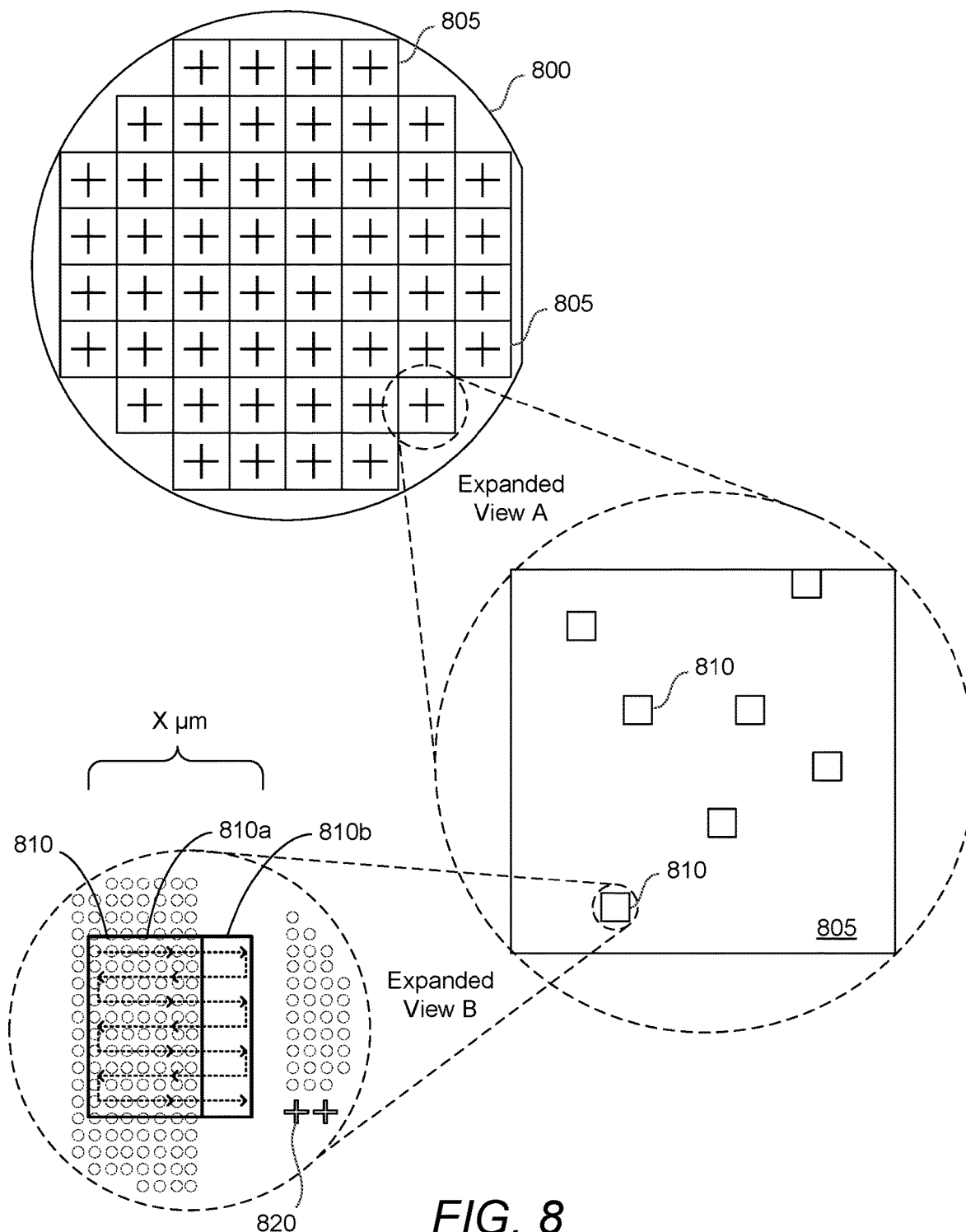
FIG. 8 is a simplified illustration of an area on a semiconductor wafer that can be analyzed according to some embodiments.

As stated above, embodiments of the disclosure can be used to delayer and form a three-dimensional image of one or more regions within many different types of samples including electronic circuits formed on semiconductor structures, solar cells formed on a polycrystalline or other substrate, nanostructures formed on various substrates and the like. As one non-limiting example, FIG. 8 is a simplified illustration of an area on a semiconductor wafer from which three-dimensional images of one or more regions of the wafer can be generated according to some embodiments. Specifically, FIG. 8 includes a top view of wafer 800 along with two expanded views of specific portions of wafer 800. Wafer 800 can be, for example, a 200 mm or 300 mm semiconductor wafer and can include multiple integrated circuits 805 formed thereon. The integrated circuits 805 can be at an intermediate stage of fabrication and the techniques described herein can be used to evaluate and analyze one or more regions 810 of the integrated circuits including regions that have two or more sub-regions having different geometries and thus exhibit different milling rates. For example, Expanded View A of FIG. 8 depicts multiple regions 810 of one of the integrated circuits 805 that can be evaluated and analyzed according to the techniques described herein. Expanded View B depicts one of those regions 810 that includes a first sub-region 810a having an array of holes formed therein and a second sub-region 810b that is a generally solid portion separating adjacent arrays of holes. Sub-regions 810a and 810b have both different geometries and include different materials, which in turn can result in different milling rates between the two sub-regions. Also shown in Expanded View B are features 820 that are located outside of but near region 810 and can be identified as unique within SEM images taken during block 720 thus enabling features 820 to serve as anchors for image registration as discussed above.

Embodiments of the disclosure can generate an accurate three-dimensional data cube of region 810 by sequentially milling away an uppermost layer of the region. The milling process can mill region 810 by scanning the FIB back and forth within the region according to a raster pattern, such as the scan pattern 430 illustrated above. The removed portion can extend across the entirety of the region 810 in both the X and Y directions but, due to the different milling rates in sub-regions 810a and 810b, the removed portion can have a depth in the Z direction that differs over time in sub-region 810*a* as compared to sub-region 810*b*. For example, if region 810 is a square having a length and width of X microns, separate and very thin slices (as thin as 1 atomic layer or less) of X by X microns can be sequentially removed from region 810 during the milling process where, in each layer, the removed square includes material from sub-region 810*a* and material from sub-region 810*b*. As the delayering process proceeds over thousands of iterations, and due to the different milling rates between the sub-regions, more layers of material might be removed in sub-region 810*a* as compared to sub-region 810*b*. Thus, a portion of SEM images taken at various intervals during the delayering process from sub-region 810*a* will include materials and features present in sub-region 810*a* that are at a different depth than a second portion of the SEM image from sub-region 810*b*. Despite the non-planar aspects of such images, embodiments can stitch together an accurate three-dimensional image of region 810 using the techniques described above.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed.

Additionally, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of evaluating a region of interest of a sample that includes different materials with different known milling rates, the method comprising:

positioning the sample within in a vacuum chamber of an evaluation tool that includes a scanning electron microscope (SEM) column and a focused ion beam (FIB) column;

acquiring a plurality of two-dimensional images of the region of interest by alternating a sequence of delayering the region of interest with a charged particle beam from the FIB column and imaging a surface of the region of interest with the SEM column; and generating a three-dimensional data cube representing the region of interest by stacking the plurality of two-dimensional images and also adjusting for estimated distortions identified based on locations of the different materials within the region of interest and differences in the known milling rates of the different materials;

segmenting the data cube into a plurality of uniform regions;

performing chemical composition measurements of each of the plurality of uniform regions; and adding results of the chemical composition measurements to the three-dimensional data cube.

2. The method of evaluating a region of a sample set forth in claim 1 wherein the region of interest includes a first sub-region and a second sub-region, adjacent to the first sub-region, and a geometry and/or materials in the first sub-region are different than a geometry and/or materials in the second sub-region such that the first sub-region has a first milling rate and the second sub-region has a second milling rate different than the first milling rate.

3. The method of evaluating a region of a sample set forth in claim 1 wherein the generating step includes:

aligning the plurality of two-dimensional images to each other;

generating an initial three-dimensional data cube representing the region of interest by stacking the plurality of aligned two-dimensional images on top of each other in an order in which they were acquired;

estimating distortions within the initial three-dimensional cube based on locations of the different materials within the region of interest and differences in the known milling rates of the different materials; and creating an updated three-dimensional data cube that includes adjustments for the estimated distortions.

4. The method of evaluating a region of a sample set forth in claim 3 wherein the updated three-dimensional data cube is created by applying an inverse transformation to correct the estimated distortions such that the estimated distortions are eliminated or diminished.

5. The method of evaluating a region of a sample set forth in claim 4 wherein applying an inverse transformation to correct the estimated distortions comprises applying reciprocal distortions to the initial data cube calculated based on the locations of and the different milling rates of the different materials.

6. The method of evaluating a region of a sample set forth in claim 3 wherein estimating the distortions further comprises comparing geometric structures measured in the initial data cube to a ground truth geometry.

7. The method of evaluating a region of a sample set forth in claim 1 wherein the chemical composition measurements are performed separately on each of the plurality of uniform regions by taking chemical composition measurements on a selected subset of delayered slices of the sample taken during the acquiring step.

8. The method of evaluating a region of a sample set forth in claim 1 wherein the chemical composition of each region is determined by averaging EDX composition measurements of each region.

9. The method of evaluating a region of a sample set forth in claim 1 further comprising creating a virtual cross-section at a pre-defined position and direction by calculating points corresponding to an intersection of the cross-section with the data cube and sampling the data cube in the calculated points.

10. The method of evaluating a region of a sample set forth in claim 1 wherein each delayering step in the sequence of delayering the region of interest with a charged particle beam from the FIB column and imaging a surface of the region of interest with the SEM column is performed by continuously scanning the focused ion beam at a constant scan rate.

11. A non-transitory computer-readable memory that stores a plurality of computer-readable instructions for evaluating a region of a sample that includes different materials with different known milling rates by:
   positioning the sample within in a vacuum chamber of an evaluation tool that includes a scanning electron microscope (SEM) column and a focused ion beam (FIB) column;
   acquiring a plurality of two-dimensional images of the region of interest by alternating a sequence of delayering the region of interest with a charged particle beam from the FIB column and imaging a surface of the region of interest with the SEM column; and
   generating a three-dimensional data cube representing the region of interest by stacking the plurality of two-dimensional images and also adjusting for estimated distortions identified based on locations of the different materials within the region of interest and differences in the known milling rates of the different materials;
   segmenting the data cube into a plurality of uniform regions;
   performing chemical composition measurements of each of the plurality of uniform regions; and
   adding results of the chemical composition measurements to the three-dimensional data cube.

12. The non-transitory computer-readable memory set forth in claim 11 wherein the computer-readable instructions for generating the three dimensional data cube include instructions for:
   aligning the plurality of two-dimensional images to each other;
   generating an initial three-dimensional data cube representing the region of interest by stacking the plurality of aligned two-dimensional images on top of each other in an order in which they were acquired;
   estimating distortions within the initial three-dimensional cube based on locations of the different materials within the region of interest and differences in the known milling rates of the different materials; and
   creating an updated three-dimensional data cube that includes adjustments for the estimated distortions.

13. The non-transitory computer-readable memory set forth in claim 11 wherein the computer instructions cause the chemical composition measurements to be performed separately on each of the plurality of uniform regions by taking chemical composition measurements on a selected subset of delayered slices of the sample taken during the acquiring step.

14. A system for evaluating a region of a sample that includes different materials with different known milling rates, the system comprising:
   a vacuum chamber;
   a sample support configured to hold a sample within the vacuum chamber during a sample evaluation process;
   a focused ion beam (FIB) column configured to direct a charged particle beam into the vacuum chamber toward the sample;
   a scanning electron microscope (SEM) column configured to direct a charged particle beam into the vacuum chamber toward the sample; and
   a processor and a memory coupled to the processor, the memory including a plurality of computer-readable instructions that, when executed by the processor, cause the system to:
      position the sample within in a vacuum chamber of an evaluation tool that includes a scanning electron microscope (SEM) column and a focused ion beam (FIB) column;
      acquire a plurality of two-dimensional images of the region of interest by alternating a sequence of delayering the region of interest with a charged particle beam from the FIB column and imaging a surface of the region of interest with the SEM column; and
      generate a three-dimensional data cube representing the region of interest by stacking the plurality of two-dimensional images and also adjusting for estimated distortions identified based on locations of the different materials within the region of interest and differences in the known milling rates of the different materials;
      segment the data cube into a plurality of uniform regions;
      perform chemical composition measurements of each of the plurality of uniform regions; and
   add results of the chemical composition measurements to the three-dimensional data cube.

15. The system according to claim 14 wherein the computer-readable instructions that generate the three dimensional data cube include instructions that:
   align the plurality of two-dimensional images to each other;
   generate an initial three-dimensional data cube representing the region of interest by stacking the plurality of aligned two-dimensional images on top of each other in an order in which they were acquired;
   estimate distortions within the initial three-dimensional cube based on locations of the different materials within the region of interest and differences in the known milling rates of the different materials; and
   create an updated three-dimensional data cube that includes adjustments for the estimated distortions.

* * * * *